United States Patent
König et al.

(10) Patent No.: US 6,350,510 B1
(45) Date of Patent: Feb. 26, 2002

(54) PROCESSING INSERT, AND PRODUCTION OF SAME

(75) Inventors: Udo König, Essen; Hendrikus Van Den Berg, Venlo-Blerick; Hartmut Westphal, Dermbach/Rhön; Volkmar Sottke, Mülheim, all of (DE)

(73) Assignee: Widia GmbH, Essen (DE)

( * ) Notice: Subject to any disclaimer, the term of this patent is extended or adjusted under 35 U.S.C. 154(b) by 0 days.

(21) Appl. No.: 09/423,123

(22) PCT Filed: May 2, 1998

(86) PCT No.: PCT/DE98/01237

§ 371 Date: Nov. 1, 1999

§ 102(e) Date: Nov. 1, 1999

(87) PCT Pub. No.: WO98/51839

PCT Pub. Date: Nov. 19, 1998

(30) Foreign Application Priority Data

May 9, 1997 (DE) .......................................... 197 19 195

(51) Int. Cl.[7] ........................... B32B 9/00; C23C 16/32; C23C 16/34; C23C 16/36

(52) U.S. Cl. .................... 428/216; 407/119; 422/255.1; 422/255.2; 422/255.3; 428/336; 428/697; 428/698; 428/699; 428/701; 428/702

(58) Field of Search ................................. 428/216, 212, 428/336, 697, 698, 699, 701, 702; 427/255.1, 255.2, 255.3; 407/119

(56) References Cited

U.S. PATENT DOCUMENTS

| | | | |
|---|---|---|---|
| 4,268,582 A | | 5/1981 | Hale et al. |
| 4,269,899 A | | 5/1981 | Fuyama et al. |
| 4,714,660 A | | 12/1987 | Gates, Jr. |
| 5,223,337 A | * | 6/1993 | Van den berg et al. ...... 428/336 |
| 5,250,367 A | * | 10/1993 | Santhanam et al. ......... 428/698 |
| 5,266,388 A | | 11/1993 | Santhanam et al. |
| 5,325,747 A | * | 7/1994 | Santhanam et al. ......... 407/119 |
| 5,496,594 A | * | 3/1996 | Konig et al. ................ 427/569 |
| 5,693,408 A | * | 12/1997 | Van den Berg et al. ..... 428/212 |
| 5,981,078 A | * | 11/1999 | Tabersky et al. ............. 51/307 |

FOREIGN PATENT DOCUMENTS

| | | |
|---|---|---|
| AT | 401 391 B | 8/1996 |
| DE | 30 27 688 B1 | 4/1981 |
| DE | 35 39 729 C2 | 5/1987 |
| DE | 288 630 | 4/1991 |
| DE | 40 24 877 A1 | 2/1992 |
| DE | 41 26 851 A1 | 2/1993 |
| DE | 42 39 234 A1 | 6/1994 |
| DE | 195 30 518 A1 | 2/1997 |
| EP | 0 032 887 A1 | 7/1981 |
| EP | 0 093 706 B1 | 11/1983 |
| EP | 0 665 308 A1 | 8/1995 |
| EP | 0 732 423 A1 | 9/1996 |
| FR | 2 171 334 | 9/1973 |
| JP | 56009366 | 1/1981 |
| JP | 61019777 | 1/1986 |
| JP | 01252305 | 10/1989 |
| JP | 3-153875 | 7/1991 |
| JP | 05177412 | 7/1993 |
| JP | 6-81169 | 3/1994 |
| WO | WO 94/12682 | 6/1994 |
| WO | WO 95/32317 | 11/1995 |

\* cited by examiner

Primary Examiner—Archene Turner
(74) Attorney, Agent, or Firm—Herbert Dubno

(57) ABSTRACT

The invention pertains to a processing insert comprised of a body with a hard metal or ceramic substrate and with a multilayer coating and the manufacture of same. In order to have a highly fracture-tough insert with a relatively thick coating, it is suggested that an external layer (protective layer) be applied according to the CVD process, said layer being either a monophase or multiphase layer of Zr-based or Hf-based carbide nitride or carbonitride, and presenting internal compressive stresses. The layer(s) underlying the external layer, also applied according to the CVD process, also present(s), without any exception, internal compressive stresses, while at least one of them, maybe the only one laying under the protective layer is made of TiN, TiC and/or TiCN. The coating is applied according to a continuous CVD process at temperatures of 900° C. to 1100° C. and involves a specific modification of the gas compounds.

14 Claims, 1 Drawing Sheet

PROCESSING INSERT, AND PRODUCTION OF SAME

CROSS REFERENCE TO RELATED APPLICATIONS

This applications is a national stage of PCT/DE98/01237 filed May 2, 1998 and based upon German national application 197 19 195.9 of May 9, 1997 under the International Convention.

FIELD OF THE INVENTION

The invention relates to a cutting insert for machining operations, consisting of a hard metal, cermet or ceramic substrate body with a multilayer coating.

BACKGROUND OF THE INVENTION

Substrate bodies coated with a hard materials, optionally also coated with multiple layers, are known to the state of the art. As a rule the hard-material coating serves for creating a wear-resistant surface layer, which is combined with tough substrate bodies mechanically capable to bear high loads. According to the state of the art, two different methods are used, so-called chemical vapor deposition (CVD) or the physical vapor deposition (PVD). The usual protective layers consist for instance of TiC, TiN and/or aluminum oxide. It has also been proposed to apply multiple layer coatings with the layer sequence TiN, Ti(C,N), Ti(C,N), TiN on a substrate body mit any desired C:N mixing ratios.

From DE 195 30 517 also metal carbonitride hard materials on a substrate body are known, wherein the metal of the metal carbonitride layer contains two or more of the elements of the group Ti, Zr, Hf, V, Nb, Ta, Cr, Mo and W. The layer is described particularly as a quaternary layer of (Ti,Zr)(C,N) obtained through CVD. As a special embodiment example for an indexable insert, a coating consisting of an approximately 1 $\mu$m thick TiN layer, a 8 $\mu$m thick (Ti,Zr)(C,N) layer and a last layer with a thickness between 3 and 5 $\mu$m of $Al_2O_3$ was deposited on a hard metal substrate body.

The already mentioned PVD coatings, which can be already produced starting from approximately 400° C., are used especially for temperature-sensitive substrate bodies, particularly for the coating of rapid machining steel, which during coating should not be subjected to high temperatures.

The references WO 92/05296 or U.S. Pat. No. 5,143,488 with a similar content indicate in addition that TiN layers deposited through the CVD process show tensile strains, while TiN coatings applied through the PVD process show compressive strains which do not lead to fracture as is the case with tensile strains. In order to improve the fracture resistance, these references propose to combine one or more CVD-layers with one or more layers deposited through PVD. As materials for the inner layer deposited by CVD, nitrides of titanium, hafnium and/or zirconium are proposed, and for the layers deposited by PVD nitrides and carbonitrides of the mentioned metals are proposed. From the point of view of process technology, there is a disadvantage in that two successive, relatively expensive, different coatings (CVD, PVD) have to be applied by means of different apparatus. Furthermore it has been found that the multilayer coating consisting of inner coatings deposited through CVD and at least one outer layer deposited through PVD tend to detach themselves from each other in case of thicker layers.

OBJECTS OF THE INVENTION

It is therefore an object of the present invention to avoid the aforementioned drawbacks. The cutting insert should have a high fracture resistance (bending strength). The process required for its manufacture should be cost-effective and performed with the minimum possible equipment expenditure.

A cutting insert for machining operations can consist of a cermet or ceramic substrate body with a multilayer coating, whose outer layer (cover layer) consists of a single-phase or multiphase layer of carbides, nitrides or carbonitrides on a Zr or Hf basis, which was applied by means of CVD and presents inner compressive strains. Its underlying layers applied also by CVD have exclusively inner tensile strains, whereby at least one or the sole underlying layer consists of TiN, TiC and/or Ti (C,N).

SUMMARY OF THE INVENTION

The multilayer coating on a hard metal, cermet or ceramic substrate body has an outer layer (cover layer) consisting of a multiple phase layer of carbides, nitrides or carbonitrides on a zirconium or hafnium basis and which has inner compressive strain. The underlying layer or layers, without exception, have tensile stresses, whereby at least one or the sole underlying layer consists of titanium nitride, titanium carbide and/or titanium carbonitride. All layers are applied by CVD, whereby also such embodiments are included wherein the cover layer can consist of several individual layers of the same or of a different material composition. It is essential for the present invention that the cover layer contain zirconium or hafnium which can be in the form of a carbide, nitride or carbonitride and can be combined with an underlying layer of a titanium carbide, nitride and/or carbonitride. Preferably the compressive strains range between −500 to −2500 MPa (compressive strains are defined with negative values in contrast to tensile strains which are defined with positive values).

As a single-phase cover layer a carbide, nitride or carbonitride of zirconium or hafnium can be selected. Alternatively thereto, there are also single-phase cover layers consisting of a carbide, nitride or carbonitride of the form $(M_1,M_2)$ $(C_xN_{1-x})$ with $M_1$=Zr or Hf and $M_2$=Ti, Hf, Nb, whereby $0 \leq x \leq 1$. In the latter case they are also defined as so-called quaternary multimetal carbonitrides.

A preferred two-phase outer layer consists of a carbide, nitride or carbonitride of zirconium or hafnium and $ZrO_2$. $ZrO_2$ can be present in monocline, tetragonal and/or cubic modification. Particularly the outer layer can contain a composition of the form $Me(C_xN_{1-x})$ with Me=Zr or Hf and $0.3 \leq x \leq 7$. If the cover layer is a single phase layer, then it differs from the two-phase layer in that it has a uniform structure and lattice constant, which includes particularly tertiary and quaternary carbides, nitrides or carbonitrides, wherein zirconium or hafnium must be present either alone or together for at least 50% by atom. The respective metal atoms then distribute themselves statistically on a sublattice, while their metalloids, carbon and nitrogen are also randomly distributed on the other sublattice.

In a two-phase layer, which consists particularly of a carbide nitride or carbonitride of zirconium or hafnium, in addition also containing $ZrO_2$, two phases, which are different as to their crystalline structure and lattice, coexist next to each other. The second phase $ZrO_2$ amounts preferably to a proportion between 15 and 60% by mass.

According to a further embodiment of the invention, between the cover layer and at least one layer close to the substrate body, one of the lower layers can consist of $Al_2O_3$.

Preferred thicknesses of the cover layer range between 2 $\mu$m and a maximum of 10 $\mu$m, whereby further preferably the total thickness of the inner layers subject to tensile strains and the outer layers subject to compressive strains ranges between 5 $\mu$m and 25 $\mu$m, particularly between 10 and 20 $\mu$m.

Preferably a first TiN-layer with a thickness up to 2 $\mu$m and one or more TiCN-layers of up to 5 $\mu$m are deposited on the substrate body, on which a single-phase or two-phase cover layer with a thickness of up to 5 $\mu$m has been deposited.

For the production of a cutting insert of the aforementioned kind the coating is performed in an uninterrupted CVD process at temperatures between 900° C. and 1100° C. through respective changes of the gas composition.

The compressive strain of an outer layer of a single-phase multimetal carbonitride can be increased particularly due to the fact that after the CVD deposition follows a heat treatment at a temperature higher than the substrate body temperature during the last deposition. The respective temperatures lie between 95° C. and below the eutectic temperature of the substrate body material. The heat treatment lasts at least for 15 minutes, so that a spinodal segregation into a titanium-rich and a zirconium-rich phase takes place.

SPECIFIC DESCRIPTION AND EXAMPLES

Figure 1:
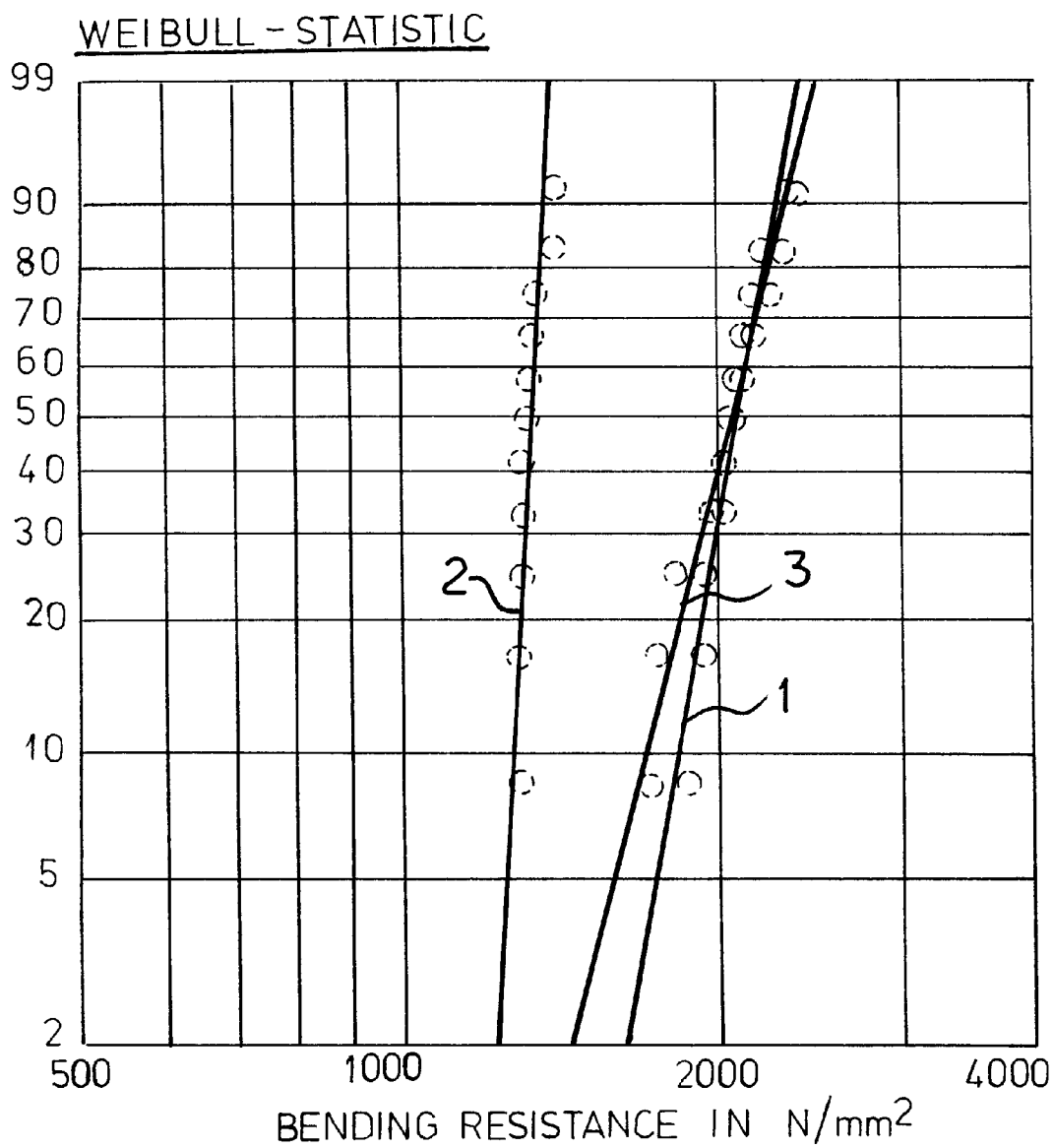
FIG. 1 is a graph illustrating the invention.

Advantageously, After the conclusion of the CVD process, the coating is additionally subjected to a mechanical surface-smoothing treatment, by means of abrasive brushes or of dry or wet blasting with fine blasting agents, preferably glass balls or corundum.

In CVD tests various coatings were applied to indexable inserts made of hard metal as shown in Table 1. In this coatings through a measuring method with X-rays (so-called $\sin^2\psi$=method) the strains in the layer bordering the cover layer have been measured. For comparison in the Table 1 also measured values of TiN and TiC layers applied through PVD are shown (see Examples 1 is and 2). These layers applied through PVD show the inherent high compressive strains known from the prior art, while the TiN, TiC and Ti(C,N) layers applied through CVD according to Examples 3 to show different high tensile strains, which is also known from the state of the art. By contrast in Examples 6 to 8 coatings according to the invention are shown, namely respectively an inner layer of Ti(C,N) and a cover layer of Zr($C_{0.49}N_{0.51}$) (Example

We claim:

1. A cutting insert for machining operations consisting essentially of a cermet or ceramic substrate body with a multilayer coating having an outer cover layer consisting of a single-phase or multiphase layer of Hf or Zr carbides, nitrides or carbonitrides applied by means of CVD providing inner compressive strains, and at least one underlying layer such that any underlying layer is applied also by CVD and has exclusively inner tensile strains, at least one underlying layer consisting of a material selected from the group which consists of TiN, TiC and Ti(C,N) or mixtures thereof, the strain relationship of said layers being such that of said layers only said outer cover layer has internal compressive strain and all of the others of said layers have internal tensile strain.

2. The cutting insert according to claim 1 wherein the outer layer is single phase and consists of a carbide, nitride or carbonitride of the form $(M_1,M_2)(C_xN_{1-x})$ with $M_1$=Zr or Hf and $M_2$=Ti, Hf, Nb and $0 \leq x \leq 1$.

3. The cutting insert according to claim 1 wherein the outer layer is a two-phase layer consisting of a carbide, nitride or carbonitride of Zr or Hf as a first phase and $ZrO_2$ as a second phase.

4. The cutting insert according to claim 1 wherein the outer layer contains $ZrO_2$ as a second phase in an amount of 15 and 60% by mass of the outer layer.

5. The cutting insert according to claim 1 wherein the cover layer has a thickness of at least 2 $\mu$m and a maximum of 10 $\mu$m.

6. The cutting insert according to claim 1 which has a layer sequence deposited on said substrate body of TiN with a thickness up to 2 $\mu$m, TiCN with a thickness up to 5 $\mu$m and a single-phase or two-phase cover layer with a thickness of up to 5 $\mu$m.

7. The cutting insert for machining operations consisting of a hard metal substrate body with a multilayer coating whose outer cover layer consists of a single-phase or multiphase layer of Zr or Hf carbides, nitrides or carbonitrides applied by CVD and providing inner compressive strain, and at least one underlying layer applied by CVD exclusively with tensile strains, including at least one underlying layer consisting of TiN, TiC and/or Ti(C,N), and a layer between the cover layer and at least one layer close to the substrate body consisting of $Al_2O_3$, the strain relationship of said layers being such that of said layers only said outer cover layer has internal compressive strain and all of the others of said layers have internal tensile strain.

8. The cutting insert according to claim 7 wherein the outer layer contains the composition Me($C_xN_{1-x}$) with Me=Zr or Hf and $0.3 \leq x \leq 7$.

9. The cutting insert according to claim 7 wherein the total thickness of all inner layers having tensile strains and of the outer layer with compressive strain ranges between 5 and 25 $\mu$m.

10. The cutting insert defined in claim 9 wherein the total thickness is 10 to 20 $\mu$m.

11. A method for producing a cutting insert according to claim 1 wherein the coating is applied through an uninterrupted CVD process at temperatures between 900° C. and 1100° C., by respectively changing the gas composition.

12. The method defined in claim 11 wherein after the deposition of the outer layer, this layer is subjected to a heat treatment above the last CVD deposition temperature and below the eutectic temperature of the substrate body for at least 15 minutes, whereby a spinodal segregation takes place.

13. The method defined in claim 12 wherein the heat treatment between 1000° C. and 1200° C. takes place in a protective-gas atmosphere.

14. The method defined in claim 11 wherein after the conclusion of the CVD process, the cover layer is subjected to an additional mechanical smoothing treatment by means of abrasive brushes or by dry or wet blasting with fine blasting agents in the form of glass balls or corundum.

* * * * *